United States Patent [19]
Dufour

[11] Patent Number: 5,485,125
[45] Date of Patent: Jan. 16, 1996

[54] PHASE-LOCKED OSCILLATOR ARRANGEMENT

[75] Inventor: Yves R. Dufour, Sunnyvale, Calif.

[73] Assignee: U.S. Philips Corporation, New York, N.Y.

[21] Appl. No.: 397,507

[22] Filed: Mar. 1, 1995

[30] Foreign Application Priority Data

Mar. 2, 1994 [FR] France ..................... 94 02383

[51] Int. Cl.$^6$ ................................. H03L 7/089
[52] U.S. Cl. ................... 331/17; 331/1 A; 331/8; 331/25; 327/7; 327/157
[58] Field of Search .................... 331/1 A, 8, 16, 331/17, 18, 25, 57; 327/2, 3, 5, 7, 8, 12, 105, 157, 158, 159; 375/120; 455/260; 360/51

[56] References Cited

U.S. PATENT DOCUMENTS

| | | |
|---|---|---|
| 4,814,726 | 3/1989 | Byrd et al. ............... 327/7 X |
| 5,095,287 | 3/1992 | Irwin et al. ............... 327/7 X |

FOREIGN PATENT DOCUMENTS

0449659  10/1991  European Pat. Off. .

Primary Examiner—David Mis
Attorney, Agent, or Firm—Leroy Eason

[57] ABSTRACT

A phase-locked variable frequency oscillator arrangement includes a voltage controlled oscillator (VCO) which is controlled by a control signal produced by charging or discharging of a capacitor in a charge pump circuit, the charge pump circuit including current sources driven by up or down command signals from a phase detector which detects the phase of the VCO output. When the command signals are simultaneously active, a logic gate circuit supplies a reset pulse to the phase detector via a delay device which is adapted to the rise times of the current in the current sources. The delay device includes a transistor (the "annexed" transistor) which forms a switched pair with one of the transistors which form the current sources. The reset signal is produced when the current of the annexed transistor reaches a selected fraction of its normal current, after being turned on by the logic gate circuit. Such circuit arrangement avoids a so-called "dead zone" of uncorrectable small phase errors around a nominal zero phase shift condition.

4 Claims, 2 Drawing Sheets

PHASE-LOCKED OSCILLATOR ARRANGEMENT

FIELD OF THE INVENTION

The invention relates to a phase-locked oscillator arrangement in which a variable-frequency oscillator supplies an output signal controlled by a control voltage from a storage capacitance, which is charged by a charge pump circuit, which arrangement comprises a phase detector which has an input which receives a signal derived from the output signal of the variable-frequency oscillator, another input which receives a signal from a reference oscillator, and a reset input, the charge pump circuit comprising two current sources which each comprise a plurality of transistors operating in parallel and which, respectively, charge and discharge the storage capacitance, which charge pump circuit has two inputs, i.e. a first control input coupled to a first output of the phase detector, which supplies a switching signal called the up-command signal, which activates one of the current sources, and a second control input coupled to a second output of the phase detector, which supplies a switching signal called the down-command signal, which activates the other current source, in which arrangement the time interval during which these two command signals are simultaneously active is controlled by a reset signal from a logic gate which combines the up-command signal and the down-command signal, which reset signal is applied to the reset input of the phase detector after passage through a delay device.

BACKGROUND OF THE INVENTION

An arrangement of this type is known from the document EP-A-449,659.

For a linear operation of the charge pump circuit it is necessary that the two current sources, which respectively charge and discharge the storage capacitance, can be active at the same time. In this way even the smallest shift in time between the up and the down command applied to the current sources of the charge pump will result in a net charge of the storage capacitance and in this way a "dead zone" in the control of the voltage across this capacitance is avoided.

However, the time during which the two current sources of the charge pump are simultaneously active should be minimised, on the one hand for reasons of current consumption, which is of particular importance when the application is of the battery-powered portable type, and on the other hand for noise reasons, bearing in mind that the noise across the storage capacitance may be considered to be zero when the two current sources are inactive and that noise appears when the two current sources are active, which noise originates both from said current sources and from their command signal.

Thus, the technical problem to be solved is to minimised the time interval during which the two current sources of the charge pump are simultaneously active.

From a technological perspective it appears that the response times are longest in the part relating to the charge pump, which employs transistors of large dimensions, whereas the control signals can be obtained by means of low-consumption logic circuits whose switching times are substantially smaller.

Therefore, it has been proposed to use the up and down commands in order to detect in a logical manner the instant at which these commands are simultaneously active and to apply the resulting signal to a delay device which allows for the comparatively large rise time of the current in the current sources of the charge pump. The signal from this delay device is then applied to a reset input of the phase detector or, which amounts to the same, to a logic device which sets the up and down command signals to their inactive logic levels.

A conventional delay device comprises a plurality of logic gates arranged in series, the delay obtained at the output of this device being equal to the sum of response times of all the gates of the device. If the performance of such a system as a function of temperature is now considered it appears that the delay produced by the delay device can be adapted correctly to the rise times of the current sources of the charge pump at a given temperature, whilst at the limit temperatures of the specified temperature range this delay is completely maladjusted.

Differences in performance as a function of the temperature arise in particular from the fact that different technologies are used for the gates forming the delay device and for the current sources of the charge pump.

In order to mitigate this problem it has also been proposed to use one of the transistors of each of the current sources of the charge pump for generating two signals which, combined by a logic gate, provide the reset signal at the output. In accordance with this technique the current supplied in the course of time is measured within the charge pump itself, so that this measurement allows for the temperature characteristics of said current sources.

Such a technique is therefore more accurate than the preceding one but has a disadvantage when such a circuit is to be operated at a low supply voltage. Two transistors in one of the current sources of the charge pump then have to be reserved exclusively for producing the signal for resetting the up and down commands, without the current supplied by these two transistors being used for charging and discharging the storage capacitance.

This is caused by the fact that if the current of the relevant transistors would be used for charging or discharging the storage capacitance this would result in the voltage swing available across this storage capacitance being reduced by two forward diode voltages.

Therefore, if low voltage operation is required with a maximal swing at the output of the phase-locked circuit, this means that two transistors, whose areas are not negligible, have to be reserved for measuring the current, the current supplied by them not being used for charging and discharging the storage capacitance.

SUMMARY OF THE INVENTION

It is an object of the invention to solve the above problems. According to the invention a phase-locked oscillator arrangement of the type defined in the opening paragraph is characterised in that the delay device comprises a current source called annexed current source, which is switchable and comprises a transistor forming a matched pair with a transistor of one of the current sources of the charge pump circuit, and comparison means for comparing the current supplied by said annexed current source with a given threshold current, which means supply the reset signal when this threshold is reached.

The arrangement in accordance with the invention thus first of all uses the up and down command signals combined in a gate detecting the active states of the relevant signals, the resulting signal then being applied to the delay device which comprises a transistor identical to that of one of the current sources, providing an indication of the turn-on delay of the actual current sources of the charge pump circuit.

Consequently, this arrangement is more compact because it uses only one instead of two transistors of comparatively large dimensions. In order to obtain a charge pump circuit which performs well it is known to match the rise times of the transistors of the two current sources with the greatest possible accuracy. The use of one additional transistor of a construction identical to that of one of the charge pump transistors thus provides a sufficiently accurate indication of the operation of the current sources of the charge pump as a function of time. However, if there is reason to assume that one of the current sources of the charge pump will be slightly slower than the other current source it may be advisable to use for the annexed current source a transistor of the same type as that used in the slower current source of the charge pump.

It is common practice to use a parallel combination of transistors to realise the current sources of the charge pump circuit, the number of active transistors being programmable depending on the use. The increase in consumption as a result of the annexed current source is then a substantially negligible fraction of the current consumed by the entire circuit, also taking into account that the annexed current source only supplies current during a very short time which is independent of the phase error to be corrected and which corresponds merely to the rise time of this annexed current source. Since it is external to the charge pump circuit the transistor forming the annexed current source is not subject to the bias restraints imposed on the transistors of the charge pump, apart from the necessity of a correct matching, as already mentioned.

A simple solution for the means for comparison of the current supplied by the annexed current source with a given current threshold is to use a load resistor in series with said annexed current source, the voltage drop across this load resistor providing the reset signal. However, this solution is not optimal in view of temperature variations. In a preferred embodiment of the invention said comparison means comprise a current mirror having an input branch receiving the current from the annexed current source and having an output branch, which forms the output of the delay device, connected in series with an output of a reference current generator which supplies said current threshold.

In this embodiment the comparison between the current supplied by the reference current generator and the current supplied by the annexed current source permits an exact choice of the fraction of the current of the annexed current source for which the reset signal is produced.

It is advantageous if the current mirror has an output current/input current ratio smaller than unity, which results in a reduced consumption, the current supplied by the reference current source being only a fraction of the nominal current of the annexed current source.

Suitably, means may be provided which oppose saturation of the transistors in series in the output branch of the current mirror. In an advantageous variant the reference current generator providing the current threshold and the current mirror are constructed by means of MOS-type field effect transistors.

BRIEF DESCRIPTION OF THE DRAWINGS

The nature of the invention and how it can be implemented will be more fully understood with the aid of the following description with reference to the accompanying drawings, given by way of non-limitative examples.

DESCRIPTION OF EMBODIMENTS

Figure 1:
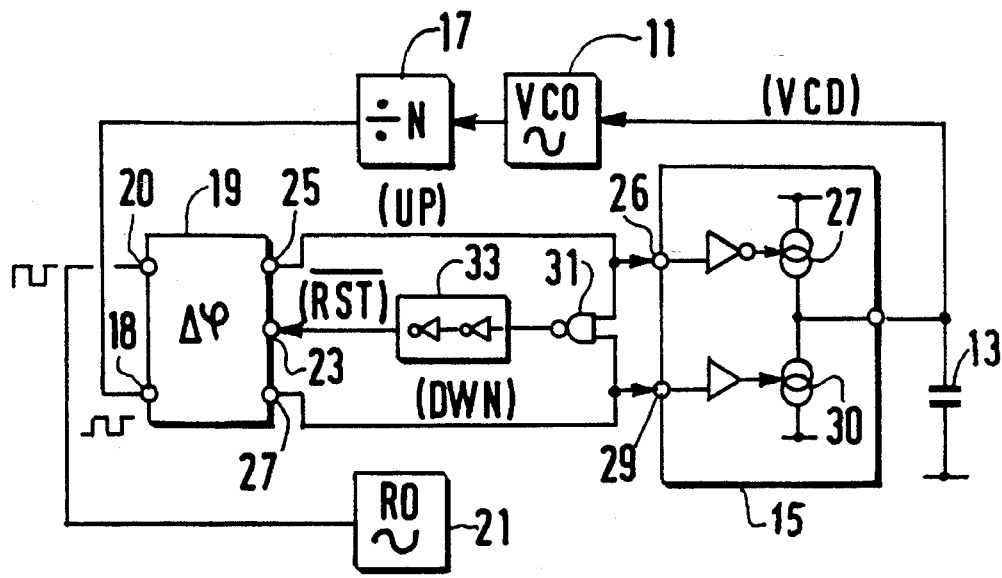
FIG. 1 is a simplified diagram of a known phase-locked oscillator/arrangement using a phase detector having a reset input and delay device for the reset signal.

FIG. 1 shows the general circuit diagram of a phase-locked oscillator arrangement based on a principle which is common to the known arrangement and the arrangement in accordance with the invention.

A variable-frequency oscillator 11 supplies an output signal whose frequency is controlled by a control voltage VCD from a storage capacitance 13, which is generally associated with a low-pass filter, not shown, which capacitance is charged or discharged by means of a charge pump circuit 15. The output signal of the oscillator 11 is divided in frequency by the divider 17, which is generally programmable, the result of this division being applied to a first input 18 of a phase detector 19. A second input 20 of this phase detector 19 receives the signal from a reference oscillator 21. The phase detector 19 has a reset input 23 by means of which the states of the two outputs 25 and 27 of this phase detector can be reset to zero independently of the input signals. The output 25 produces a up signal UP and the output 27 produces a down signal DWN, which are in synchronism with the respective rising edges of the input signals applied to the inputs 18 and 20.

The up signal UP and the down signal DWN are applied as command signals to the respective inputs 26 and 29 of the charge pump circuit 15 to activate a charging current source 27 and a discharging current source 30, respectively. The charging and discharging currents are applied to the storage capacitance 13. The current sources 27 and 30 of the charge pump circuit 15 are thus activated at instants whose difference in time is representative of the difference in phase between the signals compared by the phase detector 19, whereas the current sources are deactivated when the up and down commands are reset to their inactive states under the influence of the reset signal $\overline{RST}$ applied to the phase detector 19.

To produce the reset signal $\overline{RST}$ the up signal UP and the down signal DWN are applied to the input of a NAND gate 31, whose output signal is delayed in a delay device 33. It is evident that the logic type of the gate 31 depends on the state of the up signal UP, the down signal DWN and the reset signal $\overline{RST}$ which is assumed to be active, and on whether the delay device 33 is inverting or non-inverting. The NAND gate 31 shown in FIG. 1 is only one of the possible gate types and is merely an example.

In this way it is attempted to achieve that the current sources 27 and 30 of the charge pump circuit 15 have the time to reach a significant fraction of their nominal currents before they are turned off.

As already stated, the known solution using a plurality of gates in series in order to form the delay device is not satisfactory because it does not guarantee a correct compensation for the rise times of the current sources 27 and 30 of the charge pump circuit at any temperature.

When the delay provided by the delay device 33 is too short in relation to the rise times of the current sources 27 and 30 these current sources cannot reach a significant current supply level, so that the charge pump circuit will have a so-called "dead" zone. It becomes incapable of correcting small phase errors around zero compensation. Conversely, when the delay provided by the delay device 33 becomes too long the current sources 27 and 30 will simultaneously supply current for an excessive time interval, which results in an unnecessary supply current consumption and in an excessive noise of the frequency produced by the variable-frequency oscillator 11.

Figure 2:
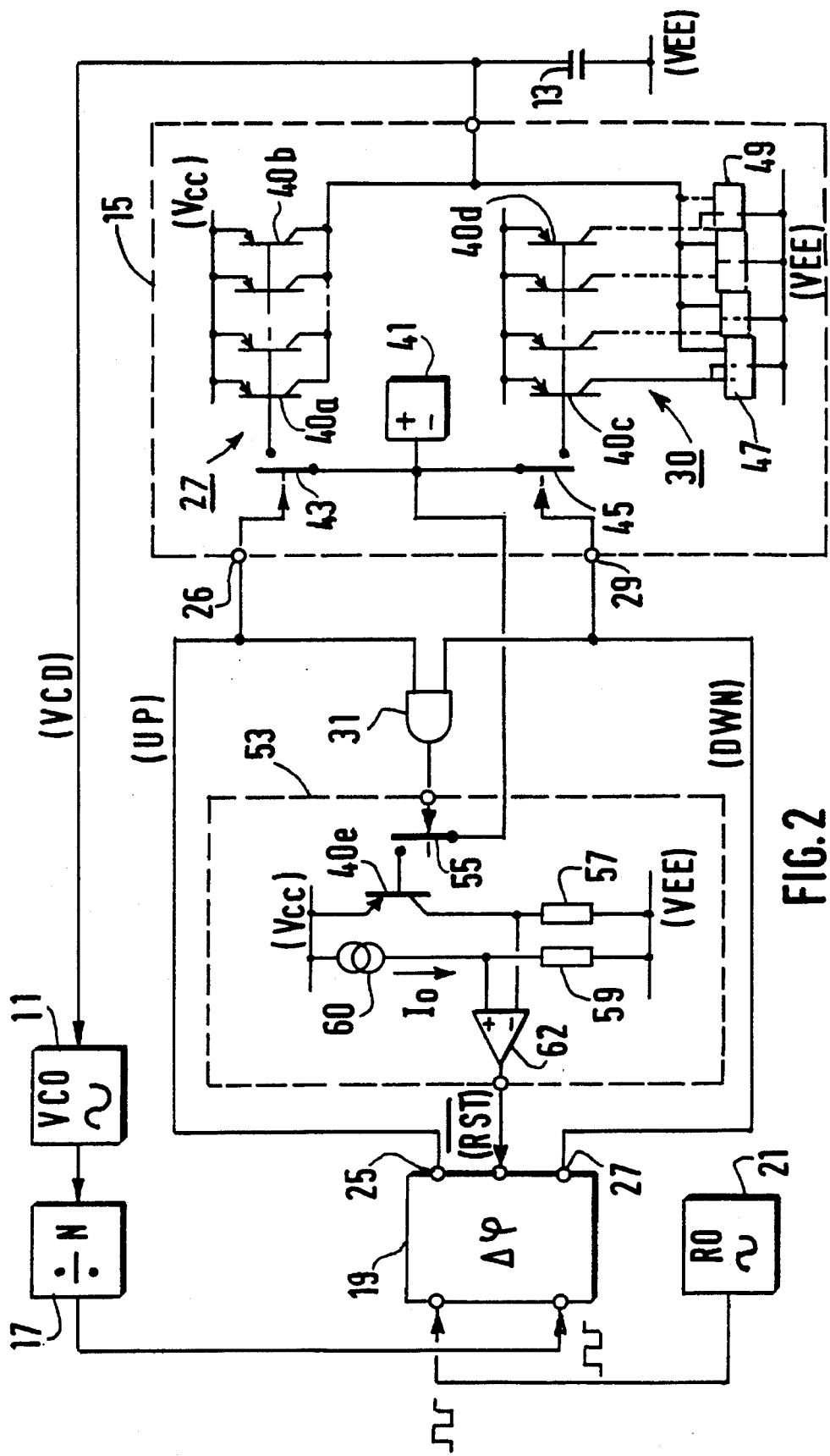
FIG. 2 is the diagram of an oscillator arrangement in accordance with the invention.

FIG. 2 shows a more detailed diagram relating to a phase-locked oscillator arrangement in accordance with the invention.

In this Figure elements having the same functions as those in FIG. 1 bear the same reference signs. In a practical example the current source 27 of the charge pump circuit 15 comprises a plurality of bipolar transistors 40a–40b of the PNP type, whose bases can be connected to a base current generator 41 under the influence of a switch 43 which is controlled by the up command signal UP. The collectors of these transistors supply the current which charges the storage capacitance 13.

In a variant, which for the sake of clarity is not shown in the Figure, the number of transistors 40a–40b operating in parallel can be programmable.

The current source 30 of the charge pump circuit 15 likewise comprises a plurality of bipolar transistors 40c–40d of the PNP type, of which all these transistors or a programmable number of them can be operated in parallel under the influence of the down command DWN, as a result of which a switch 45 is actuated and the voltage supplied by the base voltage generator 41 is applied to the bases of the transistors 40c–40d.

The collector currents of each of the transistors 40c–40d are applied to the inputs of current mirrors 47–49 formed by bipolar transistors of the NPN type, which current mirrors have their outputs coupled in parallel to supply the discharging current of the storage capacitance 13. All the transistors 40a–40b, 40c–40d are of identical construction and form matched pairs. This ensures a symmetrical operation of the current sources 27 and 30. In accordance with the invention a delay circuit 53 is formed by a PNP-type bipolar transistor 40e which receives the voltage supplied by the base voltage generator 41 at its base via a switch 55, which is controlled by an AND gate 31 receiving the up command signal UP and the down command signal DWN at its inputs. The transistor 40e is of a construction identical to and forms a matched pair with any one of the transistors 40a–40b, 40c–40d. Its switching characteristic is therefore identical to that of the current source transistors 27 and 30 at any temperature. In the present example the collector current of the transistor 40e is applied to a load resistor 57, which is also connected to a reference voltage VEE. A reference current source 60 permanently supplies a reference current $I_0$, which is applied to a resistor 59, which is also connected to the reference voltage VEE. The voltage drops produced across the resistors 57 and 59 are compared in a comparator 62, which produces the reset signal $\overline{RST}$ at its output. It is obvious that by a suitable choice of the values of the resistors 57 and 59 the reference current $I_0$ can be made smaller than the nominal current of the transistor 40e, in such a way that the consumption represented by this reference current $I_0$ can be small enough in relation to the overall consumption of the circuit.

Figure 3:
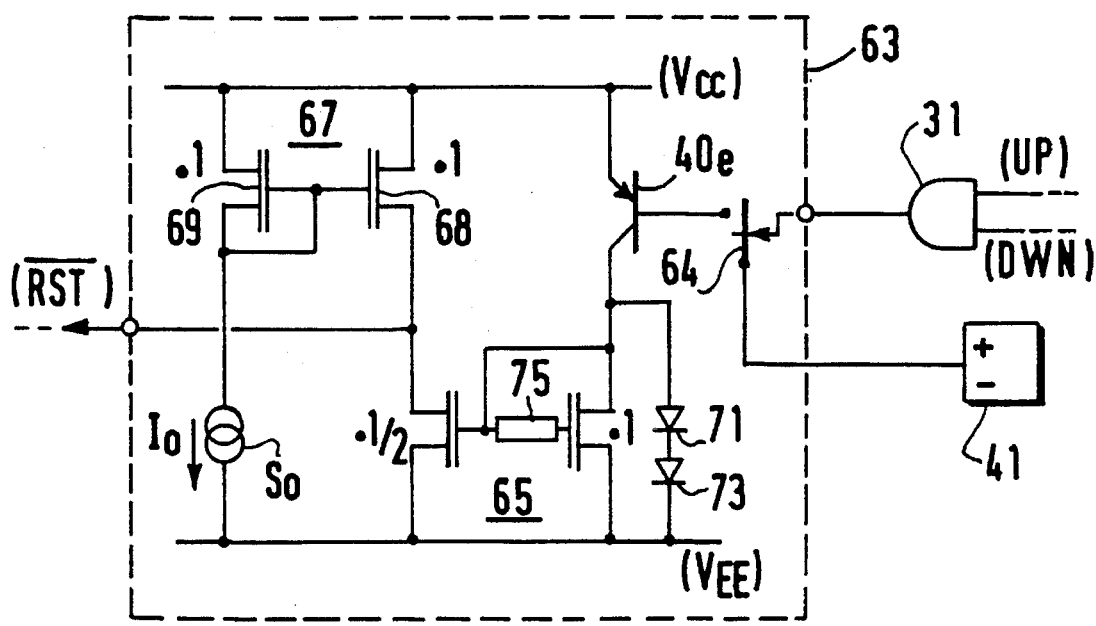
FIG. 3 shows a part of a preferred variant of the delay device provided in accordance with the invention.

FIG. 3 is the diagram of a delay device 63 in a preferred embodiment of the invention. In the same way as above this delay device 63 comprises a PNP type transistor 40e forming a matched pair with any one of the transistors 40a–40b, 40c–40d of the current sources shown in FIG. 2. The base of said transistor receives an activation signal conditioned by a logic gate 31, by means of which the simultaneous activation of the up command UP and the down command DWN can be detected. In the diagram shown in FIG. 3 the voltage supplied by the base voltage generator 41 is used for biassing the base of the transistor 40e and is applied via a switch 64 controlled by the gate 31. The means enabling an evaluation in the course of time of the current supplied by the transistor 40e, which is the image of one of the transistors of the current sources of the charge pump circuit, comprise a current mirror 65, which has an input branch receiving the collector current from the transistor 40e and an output branch connected to the output of another current mirror 67, referred to the supply voltage Vcc and comprising MOS transistors 68 and 69. Finally, a current source So, referred to the reference voltage VEE, feeds a constant current $I_0$ into the input branch of the current mirror 67. The output branch of the current mirror 65, which is coupled to the output of the current mirror 67, forms a node on which the reset signal $\overline{RST}$ appears. The combination formed by the current source So and the current mirror 67 constitutes the equivalent of a reference current source such as that bearing the reference numeral 60 in FIG. 2.

In the present case, again, the current $I_0$ supplied by the current source 60 can be only a fraction of the nominal current of the switchable current source formed by the transistor 40e. Preferably, the current mirror 65 has an output current/input current ratio smaller than unity, for example of ½ as indicated in the Figure. For a current mirror 67 with unity ratio the value of the current $I_0$ supplied by the current source So can be chosen to be, for example, 35% of the nominal current of the transistor 40e. Under these conditions, which are given purely by way of example, the reset signal $\overline{RST}$ will be produced when the current supplied by the transistor 40e has reached 70% of its nominal value. Other values of the current $I_0$ and the ratio of the current mirror 67 can be chosen to obtain the same result.

If the current mirror 67 and the current mirror 65 are realised by means of bipolar transistors it will be desirable to provide anti-saturation means for the transistors involved in the output branches of these current mirrors.

In a preferred variant shown in FIG. 3 the current mirror 67 and the current mirror 65 are realised by means of MOS field effect transistors, for which the saturation problems do not exist. The diodes 71 and 73 are connected in parallel between the bipolar transistor 40e and the reference voltage terminal VEE. This precludes saturation of this transistor. A resistor 75, shown in series with the gate of the input transistor of the current mirror 65, forms a means, known per se, of increasing the switching speed of this current mirror.

A delay circuit of this type is simple and compact. It enables the current sources of the charge pump circuit to be reset in a precisely controlled manner, thereby ensuring an optimum operation of the phase-locked oscillator.

I claim:

1. A phase-locked oscillator arrangement in which a variable-frequency oscillator supplies an output signal controlled by a control voltage from a storage capacitance, which is charged by a charge pump circuit, which arrangement comprises a phase detector which has an input which receives a signal derived from the output signal of the variable-frequency oscillator, another input which receives a signal from a reference oscillator, and a reset input, the charge pump circuit comprising two current sources which each comprise a plurality of transistors operating in parallel and which, respectively, charge and discharge the storage capacitance, which charge pump circuit has two inputs, i.e. a first control input coupled to a first output of the phase detector, which supplies a switching signal called the up-command signal, which activates one of the current sources, and a second control input coupled to a second output of the phase detector, which supplies a switching signal called the down-command signal, which activates the other current source, in which arrangement the time interval during which these two command signals are simultaneously active is controlled by a reset signal from a logic gate which combines the up-command signal and the down-command signal, which reset signal is applied to the reset input of the phase detector after passage through a delay device, characterised in that the delay device comprises a current source called annexed current source, which is switchable and comprises a transistor forming a matched pair with a transistor of one of the current sources of the charge pump circuit, and comparison means for comparing the current supplied by said annexed current source with a given threshold current, which means supply the reset signal when this threshold is reached.

2. An arrangement as claimed in claim 1, characterised in that said comparison means comprise a current mirror having an input branch receiving the current from the annexed current source and having an output branch, which forms the output of the delay device, connected in series with an output of a reference current generator which supplies said current threshold.

3. An arrangement as claimed in claim 2, characterised in that the current mirror and the reference current generator are constructed by means of MOS-type field effect transistors.

4. An arrangement as claimed in claim 1, characterised in that the transistors forming the current sources of the charge pump circuit and the transistor forming the annexed current source are PNP-type bipolar transistors.

* * * * *